United States Patent
Su et al.

(10) Patent No.: US 8,275,562 B2
(45) Date of Patent: Sep. 25, 2012

(54) METHOD FOR EVALUATING REMAINING ELECTRIC CHARGE OF A BATTERY, AND ASSOCIATED SINGLE CHIP SYSTEM

(75) Inventors: Haw-Kuen Su, Taipei (TW); Ching-Ho Chan, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 668 days.

(21) Appl. No.: 12/121,803

(22) Filed: May 16, 2008

(65) Prior Publication Data
US 2009/0287434 A1 Nov. 19, 2009

(51) Int. Cl.
G01R 31/36 (2006.01)
H02J 7/06 (2006.01)
G01N 27/416 (2006.01)

(52) U.S. Cl. .............. 702/63; 320/163; 324/426
(58) Field of Classification Search .............. 702/63, 702/57, 60, 64–67, 81, 84, 127, 130–131, 702/182–183, 188–189; 320/118, 124, 127, 320/134–136, 150, 152, 162–164; 324/426–437; 429/90–93; 340/635, 636.1; 700/286, 297; 703/5, 13, 18, 21; 713/300, 320, 323, 340
See application file for complete search history.

(56) References Cited

U.S. PATENT DOCUMENTS

| | | | | |
|---|---|---|---|---|
| 5,633,573 A | * | 5/1997 | van Phuoc et al. | 320/128 |
| 5,955,869 A | * | 9/1999 | Rathmann | 320/132 |
| 6,832,171 B2 | | 12/2004 | Barsoukov et al. | |
| 7,557,540 B2 | | 7/2009 | Kao | |
| 2007/0170893 A1 | | 7/2007 | Kao | |

FOREIGN PATENT DOCUMENTS
CN 1710440 A 12/2005
* cited by examiner

Primary Examiner — Toan M Le
(74) Attorney, Agent, or Firm — Winston Hsu; Scott Margo

(57) ABSTRACT

A method for evaluating a remaining electric charge of a battery that is utilized for supplying a single chip system includes: receiving signals from the battery and outputting parameters corresponding to the received signals; temporarily storing the parameters; and calculating the remaining electric charge, and when the single chip system wakes up from a sleep mode, updating the remaining electric charge according to the temporarily stored parameters. An associated single chip system includes: a power management unit for receiving signals from a battery and outputting parameters corresponding to the received signals; a storage unit, coupled to the power management unit, for temporarily storing the parameters; and a control unit, coupled to the storage unit, for calculating a remaining electric charge, wherein when the single chip system wakes up from a sleep mode, the control unit updates the remaining electric charge according to the parameters from the storage unit.

22 Claims, 4 Drawing Sheets

METHOD FOR EVALUATING REMAINING ELECTRIC CHARGE OF A BATTERY, AND ASSOCIATED SINGLE CHIP SYSTEM

BACKGROUND

The present invention relates to battery power gauging of a portable device, and more particularly, to a method for evaluating a remaining electric charge of a battery, and to an associated single chip system.

As portable devices on the market increase in number and develop prosperously and diversely, battery power gauging has been an essential issue. According to a related art method, simply measuring an output voltage of a battery is widely applied to various kinds of portable devices in order to perform battery power gauging. This related art method indeed saves costs since it suggests simply measuring the output voltage of the battery. However, low accuracy is certainly introduced, causing great inconvenience to the users of portable devices implemented according to the related art method.

In order to solve this problem, another related art method is proposed to use a high-cost battery having a specific circuit embedded therein. In addition, due to great differences between the high-cost battery and a conventional battery, many corresponding costs of the portable devices (such as design, material and labor costs) are also increased accordingly. Thus, those who implement portable devices according to this related art method will suffer from a high overall cost due to the high-cost battery. As a result, when a portable device requiring the high-cost battery to be an essential accessory thereof is launched on the market, the price of the portable device is surely unpleasant to many end users. Therefore, no matter how useful or powerful the portable device is, it can only serve a low percentage of potential end users since the sticker shock scares away other users.

Another related art method is further proposed to implement the specific circuit mentioned above to be a battery gauge integrated circuit (IC) 20 as illustrated in FIG. 1. Please note that the battery gauge IC 20 is coupled to a single cell Li-ion battery pack 10 through a plurality of terminals PACK+, T and PACK−, and is further coupled to a system 30 implemented with at least one IC, where a resistor $R_{sense}$ is a high accuracy resistor for sensing an output current of the single cell Li-ion battery pack 10.

Implementing the architecture shown in FIG. 1, according to this related art method, typically requires two additional ICs, resulting in additional costs of implementing a portable device comprising the battery gauge IC 20. As shown in FIG. 1, at least four ICs are typically required in total, such as the battery gauge IC 20, the system 30, an Electrically Erasable Programmable Read Only Memory (EEPROM) 40 utilized by the battery gauge IC 20, and an external memory 50 utilized by the system 30. As the cost of the battery gauge IC 20 is still considered high to most system manufactures, the price of the portable device comprising the battery gauge IC 20 shall be high to end users. Similarly, no matter how useful or powerful the portable device is, it can only serve a low percentage of potential end users since the sticker price will scare away the potential buyers.

According to another related art method, it is suggested to implement a battery gauge IC with an EEPROM embedded therein, in order to decrease the total number of ICs. However, the cost of the battery gauge IC implemented according to this related art method is still high to most system manufactures.

As mentioned, related art problems such as the low accuracy of battery power gauging implemented by simply measuring the output voltage of the battery and the corresponding inconvenience to users due to the low accuracy still exist. In addition, neither the high-cost battery nor the battery gauge IC 20 and the like have really solved the related art problems mentioned above. Thus, a novel method and associated system are therefore required for solving the related art problems.

SUMMARY

An exemplary embodiment of a single chip system comprises: a power management unit; a storage unit, coupled to the power management unit; and a control unit, coupled to the storage unit. The power management unit is utilized for receiving signals from a battery and outputting parameters corresponding to the received signals, wherein the battery is utilized for supplying the single chip system that is capable of evaluating a remaining electric charge of the battery. In addition, the storage unit is utilized for temporarily storing the parameters. Additionally, the control unit is utilized for calculating the remaining electric charge, wherein when the single chip system wakes up from a sleep mode, the control unit updates the remaining electric charge according to the parameters from the storage unit.

An exemplary embodiment of a method for evaluating a remaining electric charge of a battery that is utilized for supplying a single chip system comprises: receiving signals from the battery and outputting parameters corresponding to the received signals; temporarily storing the parameters; and calculating the remaining electric charge, and when the single chip system wakes up from a sleep mode, updating the remaining electric charge according to the temporarily stored parameters.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
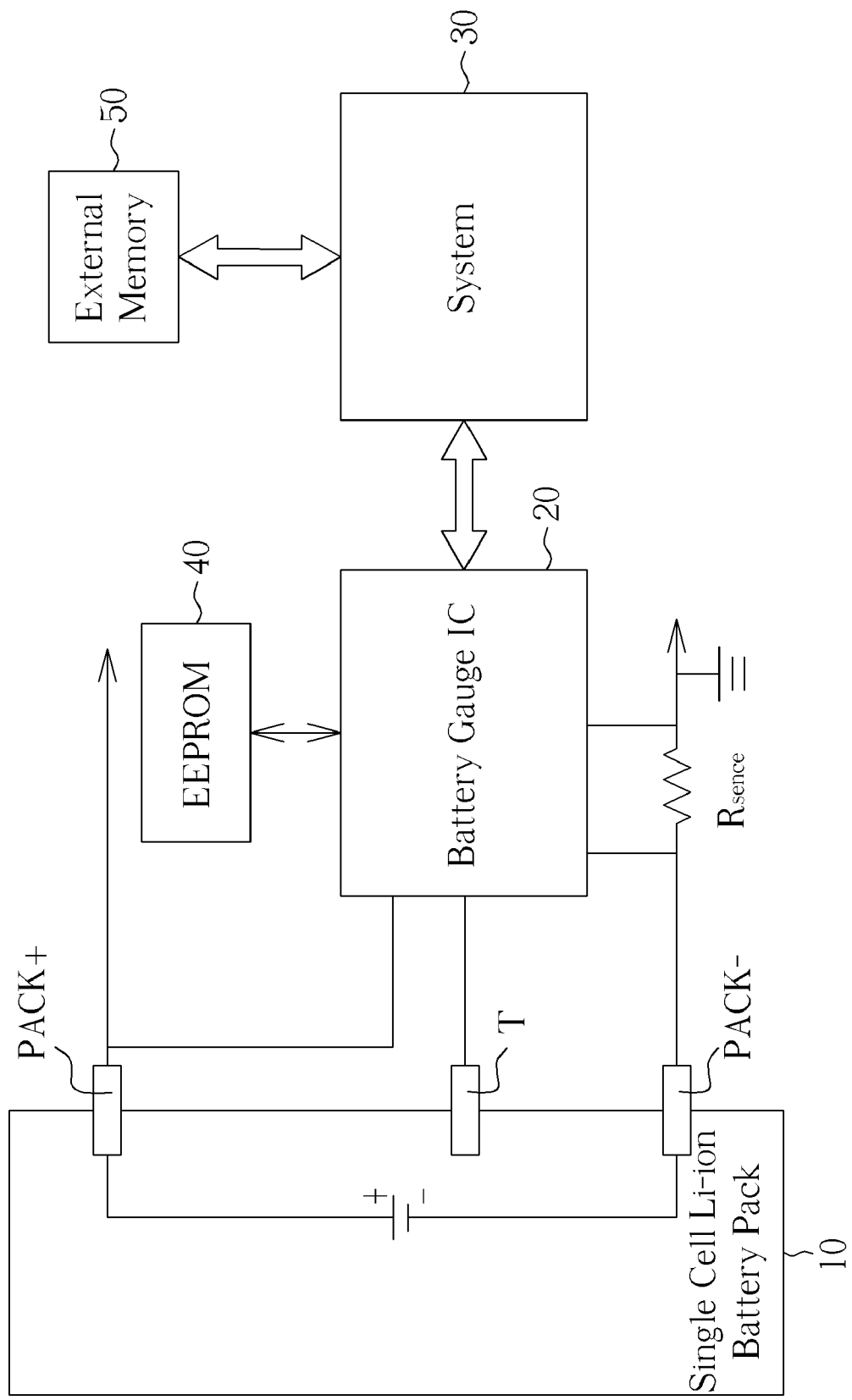
FIG. 1 illustrates a battery gauge integrated circuit (IC) coupled between a single cell Li-ion battery pack and a system according the related art.
Figure 2:
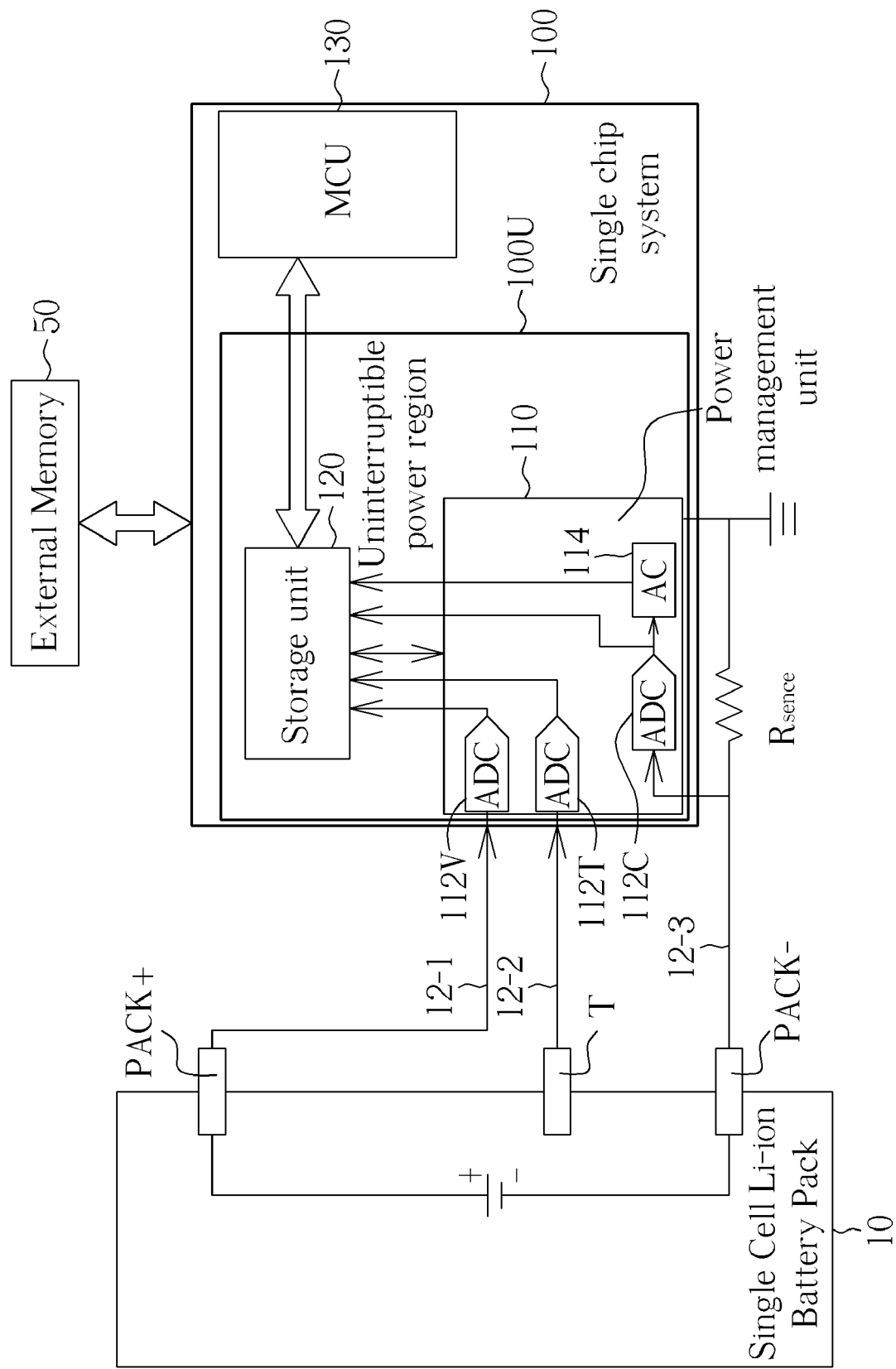
FIG. 2 is a diagram of a single chip system coupled to a battery such as the single cell Li-ion battery pack shown in FIG. 1 according to an embodiment of the present invention.

Please refer to FIG. 2. FIG. 2 is a diagram of a single chip system 100 coupled to a battery such as the single cell Li-ion battery pack 10 shown in FIG. 1 according to one embodiment of the present invention, where the single chip system 100 is capable of accessing an external memory such as the external memory 50 shown in FIG. 1. Although the single cell Li-ion battery pack 10 is taken as an example of the battery, it is not meant to be a limitation of the present invention. The battery in a variation of this embodiment can be replaced with a multi-cell Li-ion battery pack. The single chip system 100 comprises a power management unit 110, a storage unit 120 and a control unit such as a micro control unit (MCU) 130. The power management unit 110 of this embodiment comprises a plurality of analog-to-digital converters (ADCs) 112V, 112T and 112C, and further comprises an accumulation circuit 114 (labeled "AC") coupled to at least one ADC of the ADCs 112V, 112T and 112C. For example, the accumulation circuit 114 is coupled to the ADC 112C. As shown in FIG. 2, a resistor such as the resistor $R_{sense}$ is arranged to sense a current such as an output current of the single cell Li-ion battery pack 10.

According to this embodiment, the storage unit 120 is a memory within an uninterruptible power region 100U of the single chip system 100. In addition, the power management unit 110 is also implemented within the uninterruptible power region 100U. When the single chip system 100 is in a sleep mode, the power management unit 110 is intermittently active and is capable of accessing the storage unit 120. In the sleep mode, the MCU 130 and other circuitries outside the uninterruptible power region 100U within the single chip system 100 are kept inactive.

Figure 3:
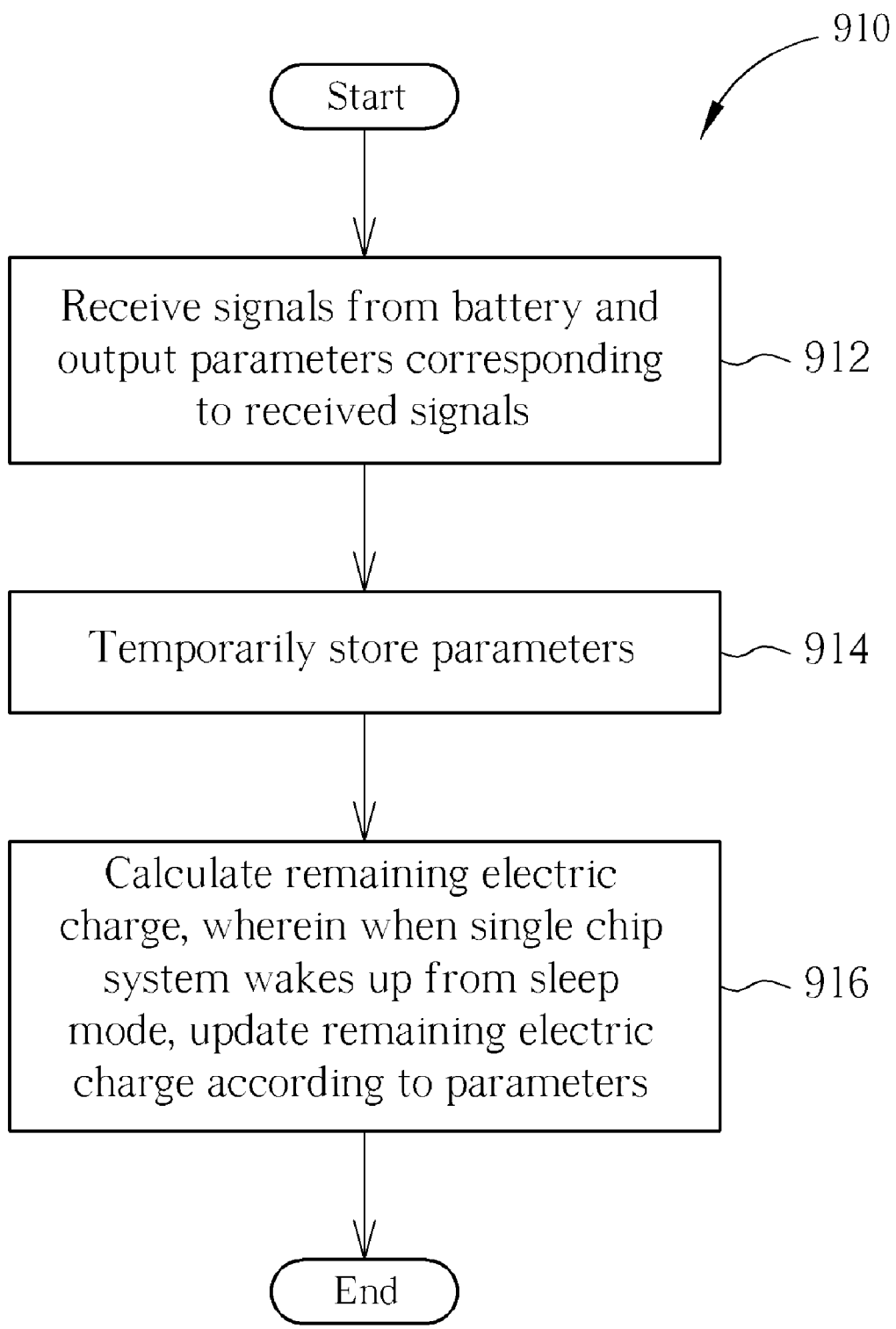
FIG. 3 illustrates a flowchart of a method for evaluating a remaining electric charge of a battery according to one embodiment of the present invention, where the battery is utilized for supplying a single chip system.

FIG. 3 illustrates a flowchart of a method 910 for evaluating a remaining electric charge of a battery such as the single cell Li-ion battery pack 10 according to one embodiment of the present invention, where the battery is utilized for supplying a single chip system such as the single chip system 100. The method 910 can be applied to the apparatus 100 shown in FIG. 2, and can be implemented by utilizing the apparatus 100. Thus, the method 910 is described with the embodiment as follows:

In Step 912, the power management unit 110 receives signals from a battery such as the single cell Li-ion battery pack 10 and outputs parameters corresponding to the received signals. In this embodiment, the power management unit 110 receives signals 12-1, 12-2 and 12-3 through the ADCs 112V, 112T and 112C from the terminals PACK+, T and PACK− of the single cell Li-ion battery pack 10, respectively. In addition, the ADCs 112V, 112T and 112C is arranged to convert the signals 12-1, 12-2 and 12-3 from the battery into a plurality of digital values, respectively.

As the signals 12-1, 12-2 and 12-3 of this embodiment represent an output voltage, a temperature and the output current of the single cell Li-ion battery pack 10, the digital values from the ADCs 112V, 112T and 112C can be utilized as representatives of the output voltage, the temperature and the output current of the single cell Li-ion battery pack 10, respectively. Additionally, the accumulation circuit 114 is arranged to accumulate digital values from the ADC 112C with respect to time, in order to derive a current accumulation value VCA corresponding to the output current, where the current accumulation value VCA is one of the parameters. As a result, the power management unit 110 outputs the parameters mentioned above to the storage unit 120. For example, the parameters of this embodiment comprise a voltage register value $V_V$, a temperature register value $V_T$, a current register value $V_C$ and the current accumulation value $V_{CA}$.

In Step 914, the storage unit 120 temporarily stores the parameters such as the register values $V_V$, $V_T$ and $V_C$ and the current accumulation value $V_{CA}$. According to this embodiment, the register values $V_V$, $V_T$ and $V_C$ are substantially set as the digital values from the ADCs 112V, 112T and 112C, respectively. In addition, the current accumulation value $V_{CA}$ is set as the output of the accumulation circuit 114. As a result, the storage unit 120 may keep all the parameters updated. Additionally, the storage unit 120 may also keep a list of the history of these parameters when needed.

As mentioned, when the single chip system 100 is in sleep mode, the power management unit 110 is intermittently active and is capable of accessing the storage unit 120. Therefore, no matter whether or not the single chip system 100 is in sleep mode, Steps 912 and 914 can be executed. Thus, when the single chip system 100 is in sleep mode, the power management unit 110 intermittently receives the signals 12-1, 12-2 and 12-3 from the battery (i.e. the single cell Li-ion battery pack 10 in this embodiment) and outputs the parameters corresponding to the received signals 12-1, 12-2 and 12-3, so the storage unit 120 temporarily stores the parameters accordingly, such as the register values $V_V$, $V_T$ and $V_C$ and the current accumulation value $V_{CA}$ mentioned above.

In Step 916, the control unit (i.e. the MCU 130 in this embodiment) calculates the remaining electric charge according to a model corresponding to characteristics of the battery. As long as the single chip system 100 is not in sleep mode, the MCU 130 often updates the remaining electric charge according to the parameters from the storage unit 120. More particularly, when the single chip system 100 wakes up from sleep mode, the MCU 130 updates the remaining electric charge according to the parameters from the storage unit 120.

According to this embodiment, the single chip system 100 is capable of correctly evaluating the remaining electric charge of the battery. Therefore, the present invention method and system indeed solve the related art problem, such as the low accuracy of battery power gauging implemented by simply measuring the output voltage of the battery and the corresponding inconvenience to users due to the low accuracy of the related art.

In contrast to the related art, the overall cost for implementing a portable device comprising the single chip system 100 of this embodiment is acceptable. When utilizing the present invention method and system, neither the high cost battery nor the battery gauge IC 20 and the like are needed for solving the related art problems mentioned above. As a result, a price of the portable device comprising the single chip system 100 will be competitive when compared to those implemented with the related art. The portable device implemented according to the present invention may serve a great number of end users with its useful and powerful functions since the price will be pleasant to the end users.

Figure 4:
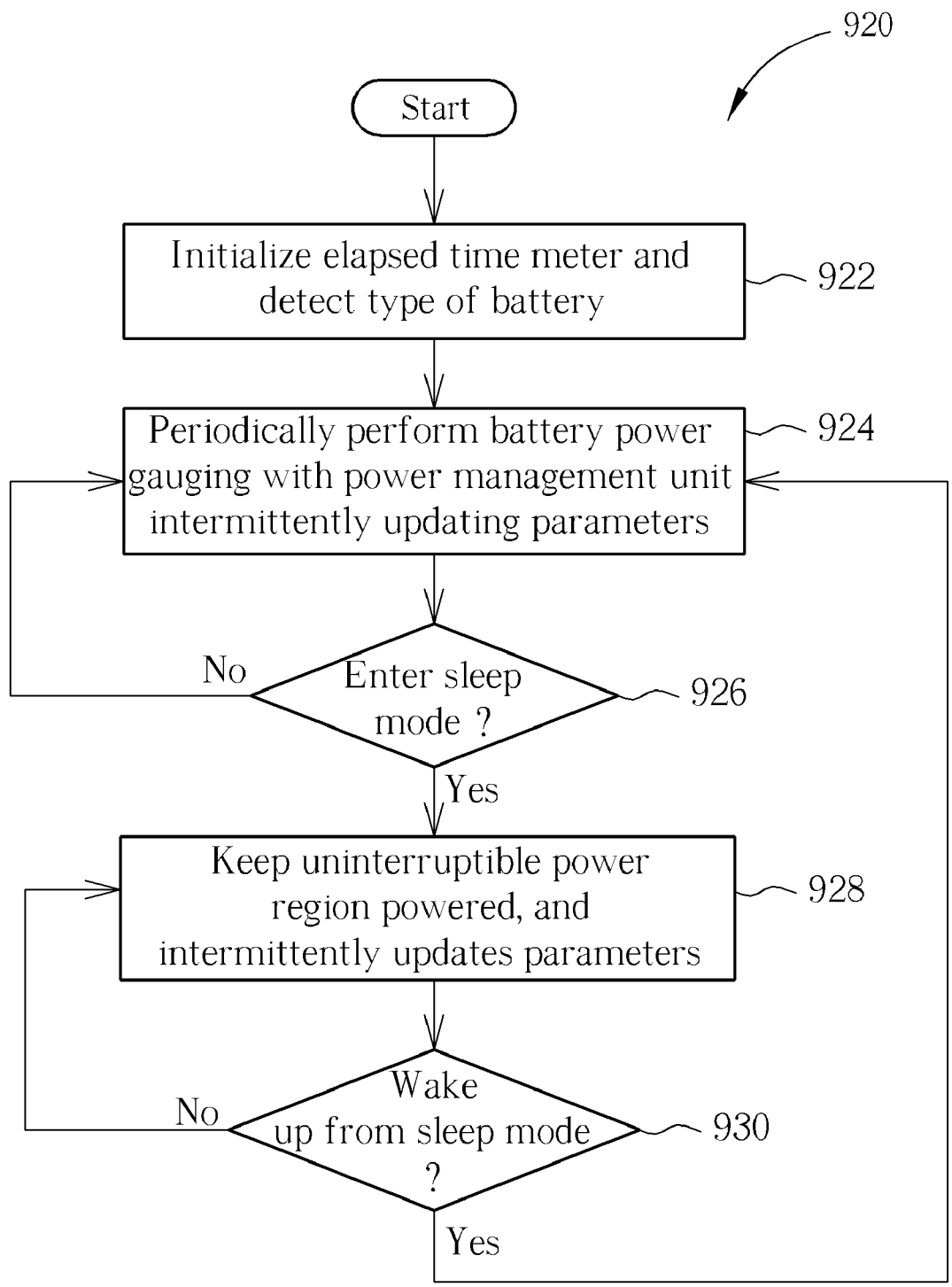
FIG. 4 is a flowchart illustrating a workflow for implementing the method shown in FIG. 3 according to one embodiment of the present invention.

FIG. 4 is a flowchart illustrating a workflow 920 for implementing the method 910 shown in FIG. 3 according to one embodiment of the present invention.

In Step 922, the MCU 130 initializes an elapsed time meter and further detects a type of the battery, wherein the elapsed time meter is typically implemented with a software module of the MCU 130, such as a program code executed by the MCU 130. As a result of the detection of the type of battery, the characteristics of the battery can be correctly selected from a battery characteristics database. For example, the battery characteristics database of this embodiment can be stored in the external memory 50 in advance. By performing the initialization regarding battery power gauging of the battery as mentioned in this step, the MCU 130 may setup any required information for the model mentioned above.

In Step 924, the MCU 130 periodically performs battery power gauging with the power management unit 110 intermittently updating the parameters as mentioned above (e.g., the operations mentioned in Steps 912 and 914). For example, every second, the power management unit 110 updates the parameters temporarily stored in the storage unit 120, and the MCU 130 updates the remaining electric charge according to the parameters from the storage unit 120.

In Step 926, the MCU 130 checks whether the single chip system 100 should enter the sleep mode. When the MCU 130 determines the single chip system 100 should enter sleep mode, Step 928 is entered; otherwise, Step 924 is re-entered.

In Step 928, the power management unit 110 keeps the uninterruptible power region 100U powered, and intermittently updates the parameters as mentioned above (e.g., the operations mentioned in Steps 912 and 914). For example, every second, the power management unit 110 updates the parameters temporarily stored in the storage unit 120.

In Step 930, the power management unit 110 checks whether the single chip system 100 should wake up from sleep mode. When the power management unit 110 determines the single chip system 100 should wake up from sleep mode, Step 924 is re-entered; otherwise, Step 928 is re-entered.

It should be noted that, when the battery is flat, the uninterruptible power region 100U is not powered. As a result, as long as the storage unit 120 is not implemented with a non-volatile memory, data loss will occur whenever the battery is flat. In this situation, Step 922 is re-executed so that the remaining electric charge can be correctly updated. Thus, when it is detected that the battery is flat, the MCU 130 performs the initialization regarding battery power gauging of the battery. More particularly, when it is detected that the battery is flat, the MCU 130 initializes the elapsed time meter and detects the type of the battery.

According to a variation embodiment, the storage unit 120 can be implemented with a non-volatile memory, where it is not necessary to position the non-volatile memory of this variation within the uninterruptible power region 100U as long as the data access by the power management unit 110 in the sleep mode is not hindered.

According to another variation embodiment, when the single chip system 100 is in sleep mode, the power management unit 110 is not active. According to this variation, Step 928 can be replaced with a virtual step doing nothing, or can be replaced with a waiting step that just waits for a certain period of time. Thus, when the single chip system 100 is in sleep mode, the power management unit 110 of this variation does not output the parameters corresponding to the received signals 12-1, 12-2 and 12-3.

Those skilled in the art will readily observe that numerous modifications and alterations of the device and method may be made while retaining the teachings of the invention.

What is claimed is:

1. A single chip system comprising:
    a power management unit for receiving signals from a battery and outputting parameters corresponding to the received signals, wherein the battery is utilized for supplying the single chip system that is capable of evaluating a remaining electric charge of the battery;
    a storage unit, coupled to the power management unit, for temporarily storing the parameters, wherein the parameters stored in the storage unit are updated when the single chip system is in a sleep mode; and
    a control unit, coupled to the storage unit, for calculating the remaining electric charge, wherein when the single chip system wakes up from the sleep mode, the control unit updates the remaining electric charge according to the parameters from the storage unit.

2. The single chip system of claim 1, wherein the power management unit comprises:
    a plurality of analog-to-digital converters (ADCs) for converting the signals from the battery into a plurality of digital values, respectively; and
    an accumulation circuit, coupled to at least one ADC of the ADCs, for accumulating digital values from the ADC.

3. The single chip system of claim 2, wherein the digital values from the ADC are representatives of a current of the battery; and the accumulation circuit accumulates the digital values from the ADC to derive a current accumulation value corresponding to the current, wherein the current accumulation value is one of the parameters.

4. The single chip system of claim 1, wherein the storage unit is a non-volatile memory.

5. The single chip system of claim 1, wherein the storage unit is a memory within an uninterruptible power region of the single chip system.

6. The single chip system of claim 1, wherein the signals received by the power management unit represent an output voltage, a current and a temperature of the battery, respectively.

7. The single chip system of claim 1, wherein the control unit calculates the remaining electric charge according to a model.

8. The single chip system of claim 7, wherein the model corresponds to characteristics of the battery.

9. The single chip system of claim 1, wherein when the single chip system is in the sleep mode, the power management unit is intermittently active.

10. The single chip system of claim 1, wherein when the single chip system is in the sleep mode, the power management unit is not active.

11. The single chip system of claim 1, wherein when it is detected that the battery is flat, the control unit performs initialization regarding battery power gauging of the battery.

12. A method for evaluating a remaining electric charge of a battery, the battery being utilized for supplying a single chip system, the method comprising:
    receiving signals from the battery and outputting parameters corresponding to the received signals;
    temporarily storing the parameters, and updating the stored parameters when the single chip system is in a sleep mode; and
    calculating the remaining electric charge, and when the single chip system wakes up from the sleep mode, updating the remaining electric charge according to the temporarily stored parameters.

13. The method of claim 12, wherein the step of receiving signals from the battery and outputting parameters corresponding to the received signals further comprises:
    converting one of the signals from the battery into a plurality of digital values; and
    accumulating the digital values.

14. The method of claim 13, wherein the step of accumulating the digital values further comprises:
    accumulating the digital values to derive a current accumulation value corresponding to a current of the battery, wherein the current accumulation value is one of the parameters.

15. The method of claim 12, wherein the step of temporarily storing the parameters further comprises:
temporarily storing the parameters into a non-volatile memory.

16. The method of claim 12, wherein the step of temporarily storing the parameters further comprises:
temporarily storing the parameters into a memory within an uninterruptible power region of the single chip system.

17. The method of claim 12, wherein the signals received by the power management unit represent an output voltage, a current and a temperature of the battery, respectively.

18. The method of claim 12, wherein the step of calculating the remaining electric charge further comprises:
calculating the remaining electric charge according to a model.

19. The method of claim 18, wherein the model corresponds to characteristics of the battery.

20. The method of claim 12, wherein the step of receiving signals from the battery and outputting parameters corresponding to the received signals further comprises:
when the single chip system is in the sleep mode, intermittently receiving the signals from the battery and outputting the parameters corresponding to the received signals.

21. The method of claim 12, wherein the step of receiving signals from the battery and outputting parameters corresponding to the received signals further comprises:
when the single chip system is in the sleep mode, not outputting the parameters corresponding to the received signals.

22. The method of claim 12, further comprising:
when it is detected that the battery is flat, performing initialization regarding battery power gauging of the battery.

* * * * *